United States Patent [19]

Aichinger et al.

[11] 4,400,821
[45] Aug. 23, 1983

[54] APPARATUS FOR THE MEASUREMENT OF THE X-RAY TUBE HIGH VOLTAGE

[75] Inventors: Horst Aichinger, Fuerth; Heinz E. Kranberg, Erlangen, both of Fed. Rep. of Germany

[73] Assignee: Siemens Aktiengesellschaft, Berlin & Munich, Fed. Rep. of Germany

[21] Appl. No.: 363,768

[22] Filed: Mar. 31, 1982

[30] Foreign Application Priority Data

Apr. 10, 1981 [DE] Fed. Rep. of Germany ....... 3114699

[51] Int. Cl.³ ..................... H05G 01/26; H05G 01/28
[52] U.S. Cl. ......................................... 378/97; 378/98
[58] Field of Search .................... 378/97, 207, 98, 112, 378/96

[56] References Cited

U.S. PATENT DOCUMENTS 3,515,873 6/1970 Higgins et al. ...................... 378/207
4,361,900 11/1982 Siedband ............................. 378/98

Primary Examiner—Alfred E. Smith
Assistant Examiner—T. N. Grigsby
Attorney, Agent, or Firm—Hill, Van Santen, Steadman & Simpson

[57] ABSTRACT

In an exemplary embodiment, two radiation detectors are present which are covered on their inlet sides for the radiation by two x-ray filters of different absorption. A divider divides the two output signals of the radiation detectors so that its output signal is a measure of the time variation of x-ray tube voltage during an exposure. The output signal of the divider is supplied to a time measurement circuit which provides a measure of the exposure time during which the x-ray tube voltage is greater than or equal to a predetermined value.

2 Claims, 1 Drawing Figure

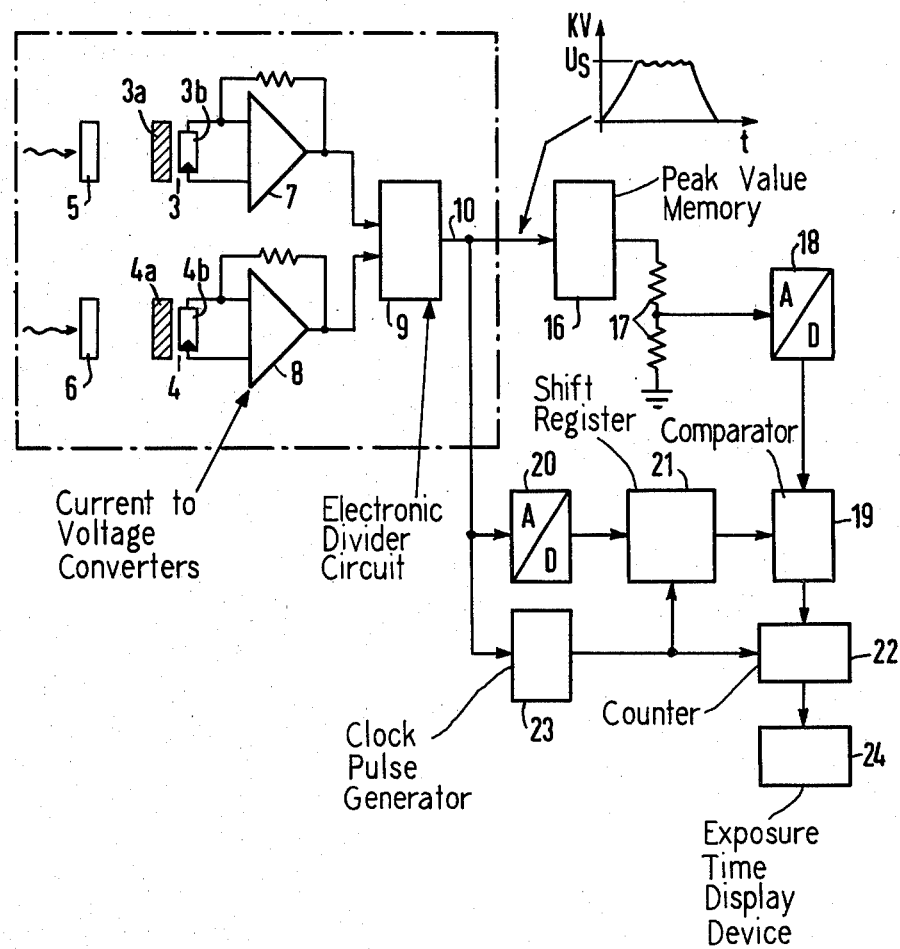

APPARATUS FOR THE MEASUREMENT OF THE X-RAY TUBE HIGH VOLTAGE

BACKGROUND OF THE INVENTION

The invention relates to an apparatus for the measurement of the x-ray tube high voltage in the case of an x-ray diagnostic system which exhibits two radiation detectors which are covered on their inlet sides for the radiation by two x-ray filters of varying absorption, and in which a divider for the two output signals of the radiation detectors is present.

An apparatus of this type is described in the German Patent Application No. P 30 14 879.9. In this apparatus, a signal corresponding to the x-ray tube voltage is formed and displayed or employed for the purpose of control of the x-ray tube voltage.

Specifications exist according to which the exposure time for a radiograph is only to be measured when the x-ray tube voltage is greater than or equal to 75% of the x-ray tube peak voltage. To this end, in a known fashion, an oscillograph for the detection of the chronological progression of the x-ray tube voltage is employed. On the basis of the chronological progression thus detected, the exposure time can then be determined taking into account these specifications.

SUMMARY OF THE INVENTION

The object underlying the invention resides in designing an apparatus of the type initially cited such that the detection of the exposure time of a radiograph takes place when the x-ray tube voltage is greater than or equal to a specific percentage of the x-ray tube peak voltage.

In accordance with the invention, this object is achieved in that the outlet signal of the divider is supplied to a time measuring circuit which detects the exposure time while the x-ray tube voltage is greater than or equal to a predetermined value. The apparatus of the initially cited type thus, in this case, also serves the purpose of measuring the exposure time, taking into account the cited specifications.

An expedient electric circuit embodiment of the inventive apparatus provides that the time measurement circuitry includes a percent circuit for the formation of a signal which corresponds to a specific percentage of the peak value of the x-ray tube voltage, and that a comparator is present which compares the signal of the percent circuit with the respective value of the x-ray tube voltage and activates a counter while the x-ray tube voltage lies above the selected percentage of the peak value. In this embodiment, the respective current counter reading is directly a measure of the exposure time, taking into account the cited specifications.

The invention shall be explained in greater detail in the following on the basis of an exemplary embodiment illustrated on the accompanying drawing sheet; and other objects, features and advantages will be apparent from this detailed disclosure and from the appended claims.

BRIEF DESCRIPTION OF THE DRAWING

The single FIGURE is an electric circuit diagram showing an exemplary embodiment of the invention.

DETAILED DESCRIPTION

In the drawing, for the measurement of the x-ray tube high voltage, two radiation detectors 3 and 4 are presented which are comprised of one scintillation crystal 3a and 4a each, respectively, and a photodiode 3b and 4b, respectively, and, on their inlet sides for the radiation, are covered by two x-ray filters 5 and 6 of different absorption. The output signals of the radiation detectors 3 and 4 are supplied, via current-to-voltage converters 7 and 8, to a divider 9. The output signal of the divider 9 at the output 10 represents a measure of the x-ray tube high voltage.

The signal corresponding to the x-ray tube high voltage is supplied to a peak value memory 16 which ascertains the peak value of the signal which varies as a function of time corresponding to the x-ray tube high voltage. Via an outlet-connected voltage divider 17 the 75%-value is immediately formed. After conversion in an analog-to-digital converter 18, the 75%-value is connected in binary form to one input of a comparator 19.

The signal corresponding to the x-ray tube high voltage at the output 10 of the divider 9 is, moreover, following conversion in an analog-to-digital converter 20, supplied to a shift register 21. The memory size of the shift register 21 conforms only to the rising, or falling, respectively, edge of the high voltage curve (a typical curve as a function of time being indicated in association with output 10). If the rising edge of the high voltage curve appears at the output of the shift register 21, then also the 75%-value is present at the input of the comparator 19. The comparator 19 triggers a counter 22 when the respectively present memory contents of shift register 21 are greater than or equal to 0.75 × the peak value of the x-ray tube voltage as supplied by voltage divider 17 and converter 18. The sum of the clock pulses, counted in this manner, delivered by a clock pulse generator 23, is equal to the exposure time, taking into account the specification that the latter is only to be measured when the x-ray tube voltage is equal to or greater than 75% of the peak value. It can be displayed by means of a display device 24.

It will be apparent that many modifications and variations may be made without departing from the scope of the teachings and concepts of the present invention.

SUPPLEMENTAL DISCUSSION

In one exemplary mode of operation, the diagnostic x-ray system is to take a series of exposures, with the peak value of the x-ray tube high voltage generally at a constant value during successive exposures of the series.

In this case, the waveform shown at the output 10 would represent the first of a series of high voltage pulses produced for effecting the impingement of a series pulses of radiation energy on the radiation detectors. The value $U_s$ in the waveform represents the peak value of the x-ray tube high voltage in kilovolts (KV) during the first exposure. The signal at output 10 will have a waveform similar to the high voltage waveform shown and the peak value memory 16 will retain the peak value of the output signal at 10 over at least one further exposure. Thus throughout the remainder of the exposure series, the peak value memory 16 will supply a signal which is a measure of the peak value of the x-ray tube high voltage selected for such series of exposures. Further, as the second radiation pulse builds up in intensity, the counter 22 will only begin counting when the output signal at 10 corresponds to the output from divider 17 (based on an initial or preceding radiation pulse of the series).

For the case of a single exposure, the x-ray apparatus could be operated in advance of an actual exposure, but with the exact desired setting for the desired exposure. The converter 18 could supply a digital register for retaining the initial value of the output of divider 17 for comparison purposes during the following single actual exposure.

We claim as our invention:

1. Apparatus for the measurement of the x-ray tube high voltage of an x-ray diagnostic system, said apparatus including x-ray filters of different absorption, radiation detectors (3, 4) which are covered on their input sides for the radiation by the respective x-ray filters (5, 6) of different absorption, and a divider (9) for the output signals of the radiation detectors (3, 4) characterized in that a time measurement circuit is connected with the output of the divider (9) said time measurement circuit (16 through 24) comprising means for detecting the exposure time while the x-ray tube voltage is greater than or equal to a predetermined value.

2. Apparatus according to claim 1, characterized in that the time measurement circuit (16 through 24) includes a percent circuit (16, 17) connected with said divider (9) for the formation of a signal which corresponds to a specific percentage of the peak value of the x-ray tube voltage, and that a comparator (19) is present which compares the signal of the percent member (16, 17) with the respective value of the x-ray tube voltage, and a counter (22) controlled by the comparator such that the comparator activates the counter (22) while the x-ray tube voltage lies above the selected percentage of the peak value.

* * * * *